United States Patent [19]

Nicoll et al.

[11] Patent Number: 4,675,204

[45] Date of Patent: Jun. 23, 1987

[54] METHOD OF APPLYING A PROTECTIVE LAYER TO AN OXIDE DISPERSION HARDENED SUPERALLOY

[75] Inventors: Andrew R. Nicoll, Waltenschwil, Switzerland; Lorenz Singheiser, Eppelheim, Fed. Rep. of Germany

[73] Assignee: BBC Aktiengesellschaft Brown, Boveri & Cie, Baden, Switzerland

[21] Appl. No.: 755,055

[22] Filed: Jul. 15, 1985

[30] Foreign Application Priority Data

Jul. 17, 1984 [DE] Fed. Rep. of Germany ....... 3426201

[51] Int. Cl.⁴ .......................... B05D 3/06; B05D 1/08
[52] U.S. Cl. ....................................... 427/35; 427/34; 427/53.1
[58] Field of Search .......................... 427/34, 35, 53.1; 728/652, 678

[56] References Cited

U.S. PATENT DOCUMENTS

| | | | |
|---|---|---|---|
| 3,979,534 | 9/1976 | Rairden | 428/652 |
| 4,281,030 | 7/1981 | Silfvast | 427/53.1 |
| 4,427,723 | 1/1984 | Swain | 427/53.1 |
| 4,446,199 | 5/1984 | Gedwill et al. | 428/678 |
| 4,488,882 | 12/1984 | Dausinger et al. | 427/53.1 |
| 4,496,607 | 1/1985 | Mathias | 427/53.1 |

*Primary Examiner*—John H. Newsome
*Attorney, Agent, or Firm*—Herbert L. Lerner; Laurence A. Greenberg

[57] ABSTRACT

Method of applying a protective layer to a component made of an oxide dispersion hardened superalloy in which the surface of the component is subjected to heat treatment and/or provided with a coating before the protective layer is applied. This results in improved adhesive strength of the protective layer.

2 Claims, 2 Drawing Figures

METHOD OF APPLYING A PROTECTIVE LAYER TO AN OXIDE DISPERSION HARDENED SUPERALLOY

BACKGROUND OF THE INVENTION

1. Field of the Invention

The invention relates to a method of applying protective layers to components made of oxide dispersion hardened superalloys.

2. Description of the Prior Art

A method of applying protective layers is used in the manufacture of components which are produced from oxide dispersion hardened superalloys. Rotor blades and guide blades and heat-localization segments are examples of components produced from these alloys.

The manufacture of components from an oxide dispersion superalloy begins with the production of the powder which forms the alloy. The metals or metal compounds which are required for manufacturing the powder are mechanically alloyed in a high-energy pulverizer. Basic bodies are first produced from the powder obtained in this way by extrusion. The basic bodies are further processed into the finished components by forging, rolling, and/or machining. The oxide dispersion hardened superalloys used in manufacture contain chromium, aluminum, titanium, molybdenum, tungsten, tantalum, zirconium, boron, nickel and yttrium oxide as essential components.

Gas turbine components are subjected to the effects of high temperatures of more than 600° C. and corrosion due to contact with corrosive substances at high temperatures. For this reason they have to be provided with a protective layer which protects the components from sulfur, oil, acids, oxygen, alkaline earths, and vanadium to slow down the corrosive effects of these substances.

It is known to protect components of this type made of oxide dispersion hardened superalloys from the effect of corrosive substances by applying MCrAlY (M=metal), NiCrAlY, or CoCrAlY protective layers. If the components are, however, subjected to the effects of high temperatures, as is the case under working conditions, diffusion processes occur. Pores form as a result of the diffusion processes, in particular in the boundary region between the component and the applied protective layer as a result of the enrichment and agglomeration of the yttrium oxide particles which are distributed on the surface of the component. Disadvantageous enrichment and agglomeration of the yttria particles can also occur during coating. The quality of the coating and the adhesive properties of the protective layers are thus severely impaired and the life of the materials to be protected is reduced, with the protective layers chipping off after a short time as a result of pore formation.

SUMMARY OF THE INVENTION

An object of the invention is to provide a method which will cause the adhesive strength of protective layers on components made of oxide dispersion hardened superalloys to be improved.

With the foregoing and other objects in view, there is provided in accordance with the invention a method of applying a protective layer to a surface of a component made of an oxide dispersion hardened superalloy to improve the adhesive strength of the protective layer, comprising at least one of the steps of (a) subjecting the surface of the component to heat treatment, and
(b) providing said surface with a coating, followed by the step of
(c) applying the protective layer.

Other features which are considered as characteristic for the invention are set forth in the appended claims.

Although the invention is illustrated and described herein as embodied in a method of applying a protective layer to an oxide dispersion hardened superalloy, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which.

DESCRIPTION OF THE PREFERRED EMBODIMENTS

In the case of components which are made from oxide dispersion hardened super alloys, conventionally applied protective layers chip off in operational conditions, in particular if the components are subjected to high temperatures, since yttrium oxide particles are present in the surface region of the components and encourage the formation of pores. According to the invention, the adhesive strength of protective layers of this type is improved by a method in which the surface of the component is heat treated and/or provided with a coating before the protective layer is applied. To form the coating a substance is used which is preferably of similar type to the material of an oxide dispersion hardened superalloy. The coating is applied preferably by means of known plasma sprays, CVD, or PVD. The thickness of the coating is selected to be sufficient to prevent interactions between the material of the component and a protective layer applied thereon. The coating may consist of dispersion hardened alloy comprising 13 to 18 weight % chromium, 0.02 to 6 weight % aluminum, 0.02 to 4.25 weight % titanium, 0.4 to 4.5 weight % molybdenum, 3.75 to 6.25 weight % tungsten, 0.1 to 3 weight % tantalum, 0.02 to 0.5 weight % zirconium, and 0.01 to 0.02 weight % boron, as well as nickel, wherein the percentages are in relation to the weight of the alloy.

In order to achieve maximum adhesive strength of the protective layer, the surface of the component can be heat treated instead of a coating being applied. For this purpose, the surface to be protected may be melted to a depth of 0.3 to 0.5 mm or more using a high energy beam, e.g. a laser beam or electron beam.

Of course, the component may first of all be subjected, in particular its surface to be protected, to heat treatment, and then provided with a coating.

The heat treatment, in particular the melting of the surface to the indicated depth, leads to considerable agglomeration of the yttrium oxide particles in the region of the melted material. More particularly, as a result of the melting of the surface, yttrium oxide particles collect at particular points and the particles become immovably embedded in this layer. These embedded particles prevent the diffusion processes from being interrupted and prevent pore formation in the region of the diffusion zone.

The invention will be described further, by way of examples, with reference to the accompanying drawings.

Figure 1:
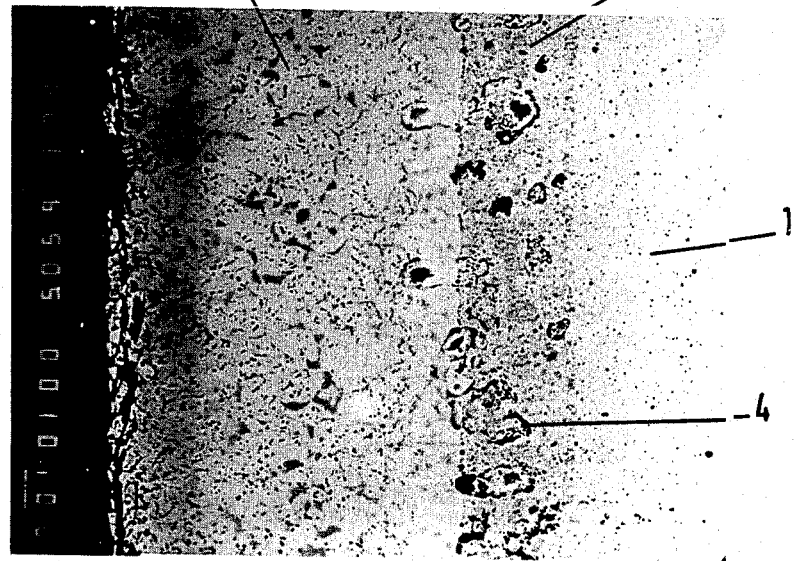
FIG. 1 is a section through a component made of oxide dispersion hardened alloy with an untreated surface.

FIG. 1 shows in section a component 1 which is intended for a gas turbine. Component 1 is produced from an oxide dispersion hardened superalloy. The component was manufactured from a fine-grained oxide dispersion hardened metallic material comprising 13 to 22 weight % chromium, 2.5 to 8 weight % aluminum, 2 to 4.25 weight % titanium, 0.4 to 4.5 weight % molybdenum, 3.75 to 6.25 weight % tungsten, 0.1 to 3 weight % tantalum, 0.02 to 0.5 weight % zirconium, 0.01 to 0.02 weight % boron, 0.02 to 2 weight % yttrium oxide, as well as nickel. The indicated percentages are in relation to the weight of the alloy used to produce the component. An alloy which has a somewhat different composition can also be used. In the production of component 1, a basic body is produced from the alloy described above by extrusion pressing. The component 1, which is shown partially in FIG. 1, is then produced by forging, rolling and/or machining. As the structure of the component 1 in FIG. 1 shows, it was coated directly with an aluminum layer 3 without further treatment. During the coating process nickel from the basic material of the component 1 diffused to the surface and reacted with the aluminum from the gas phase while the intermetallic phase was being formed, in particular while NiAl was formed. The diffusion zone 2 which occurs as a result shows a high degree of porosity, with local enrichments 4, which comprise predominantly yttrium oxide ($Y_2O_3$).

Figure 2:
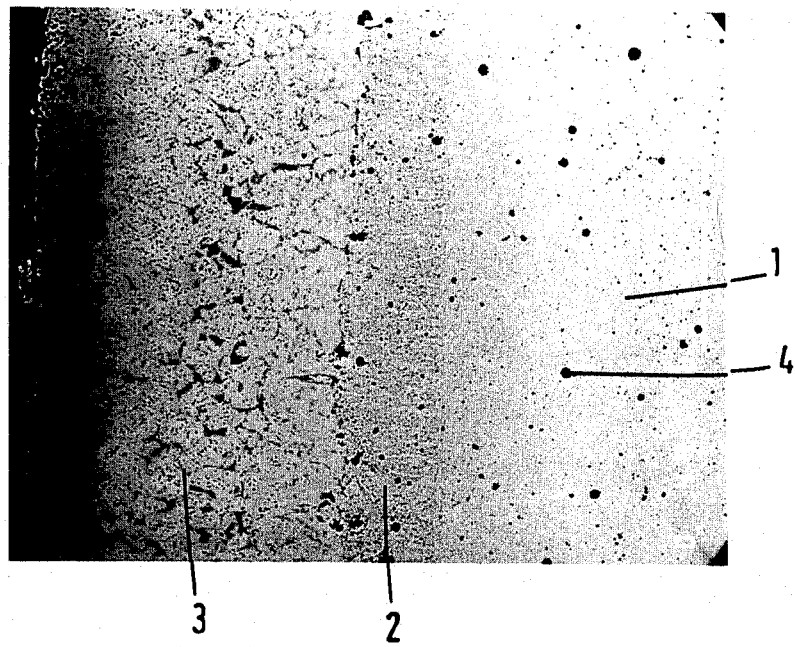
FIG. 2 is a section through a component made in accordance with the invention of an oxide dispersion hardened alloy with a heat-treated surface in which, as a result of the heat treatment, yttrium oxide particles contained in the oxide dispersion hardened superalloy of the component are re-distributed in the region of the surface of the component, agglomerated in the melted zone, and thereby immovably embedded.

FIG. 2 shows in section a component 1 produced from the same oxide dispersion hardened superalloy. Its surface was heat-treated before applying an aluminum layer 3, and more particularly was melted by the action of a high energy beam (preferably a laser beam) or an electron beam to a depth of 0.3 to 0.5 mm. In coating, a diffusion zone 2 was again formed, which differs perceptibly in its structure from the diffusion zone 2 shown in FIG. 1. There are no local enrichments 4 of $Y_2O_3$ in the zone 2 in FIG. 2. The structure of the diffusion zone 2 can be compared to diffusion zones obtained under comparable conditions in the case of $Y_2O_3$-free superalloys with the same composition. As can be seen clearly from FIG. 2, by means of the heat treatment the yttrium oxide is agglomerated in the basic material of the component 1 below the diffusion zone. This step ensures that the yttrium oxide cannot interfere in any way with the layer structure.

Also, of course, after the heat treatment, a coating described above (e.g. a $Y_2O_3$-free superalloy coating) can be applied to the component 1 and then the aluminum layer 3 applied.

The foregoing is a description corresponding, in substance, to German application P 34 26 201.6, dated July 17, 1984, international priority of which is being claimed for the instant application and which is hereby made part of this application. Any material discrepancies between the foregoing specification and the specification of the aforementioned corresponding German application are to be resolved in favor of the latter.

There is claimed:

1. Method of applying a protective layer to a surface of a component made of an oxide dispersion hardened superalloy of chromium, aluminum, titanium, molybdenum, tungsten, tantalum, zirconium, boron, nickel and yttrium oxide comprising:
   (a) subjecting said surface of the component to heat treatment of a high energy beam selected from the group consisting of an electron beam and a laser beam to melt the surface of the component at least to a depth of 0.3 to 0.5 mm to redistribute the yttrium oxide in the melted zone and to agglomerate and to immovably embed it below a diffusion zone formed during a subsequent application of a layer.
   (b) then applying a protective layer of a material selected from the group consisting of MCrAlY, wherein M=metal, NiCrAlY, CoCrAlY and aluminum, on said melted surface.

2. Method of applying a protective layer to a surface of a component made of an oxide dispersion hardened superalloy of chromium, aluminum, titanium, molybdenum, tungsten, tantalum, zirconium, boron, nickel and yttrium oxide comprising:
   (a) subjecting said surface of the component to heat treatment of a high energy beam selected from the group consisting of an electron beam and a laser beam to melt the surface of the component at least to a depth of 0.3 to 0.5 mm to redistribute the yttrium oxide in the melted zone and to agglomerate and to immovably embed it below a diffusions zone formed during a subsequent application of a layer,
   (b) then providing said surface with a coating of a dispersion hardened alloy comprising 13 to 18 weight % chromium, 0.02 to 6 weight % aluminum, 0.02 to 4.25 weight % titanium, 0.4 to 4.5 weight % molybdenum, 3.75 to 6.25 weight % tungsten, 0.1 to 3 weight % tantalum, 0.02 to 0.5 weight % zirconium and 0.01 to 0.02 weight % boron, as well as nickel, wherein the percentages are in relation to the gross weight of the alloy, followed by
   (c) applying a protective layer of a material selected from the group consisting of MCrAlY, wherein M=metal, NiCrAlY, CoCrAlY and aluminum.

* * * * *